United States Patent [19]

Drouot

[11] Patent Number: 5,300,840
[45] Date of Patent: Apr. 5, 1994

[54] REDUNDANCY FUSE READING CIRCUIT FOR INTEGRATED MEMORY

[75] Inventor: Sylvie Drouot, Le Tholonet, France

[73] Assignee: SGS-Thomson Microelectronics, S.A., Gentilly, France

[21] Appl. No.: 979,534

[22] Filed: Nov. 23, 1992

[30] Foreign Application Priority Data

Nov. 25, 1991 [FR] France ................. 91 14506

[51] Int. Cl.⁵ ......................... H03K 19/003
[52] U.S. Cl. ......................... 307/530; 307/290; 307/441; 307/443; 365/200; 365/205
[58] Field of Search ............ 307/441, 219, 202.1, 307/530, 443, 548, 290; 365/96, 200, 205, 185, 189.05–189.06, 230.06

[56] References Cited

U.S. PATENT DOCUMENTS

| | | | |
|---|---|---|---|
| 3,895,239 | 7/1975 | Alaspa | 307/268 |
| 4,013,902 | 3/1977 | Payne | 307/279 X |
| 4,140,930 | 2/1979 | Tanaka | 307/362 |
| 4,142,114 | 2/1979 | Green | 307/304 |
| 4,532,611 | 2/1985 | Countryman, Jr. | 365/200 |
| 4,591,745 | 5/1986 | Shen | 307/592 |
| 4,614,881 | 9/1986 | Yoshida et al. | 307/441 X |
| 4,633,107 | 12/1986 | Norsworthy | 307/594 |
| 4,670,676 | 6/1987 | Nishitani | 307/592 |
| 4,797,584 | 1/1989 | Aguti | 307/443 X |
| 4,812,679 | 3/1989 | Mahabadi | 307/272.3 |
| 4,818,904 | 4/1989 | Kobayashi | 307/594 |
| 4,837,520 | 6/1989 | Golke et al. | 307/441 X |
| 4,874,965 | 10/1989 | Campardo | 307/272.3 |
| 4,885,476 | 12/1989 | Mahabadi | 307/272.1 |
| 4,886,984 | 12/1989 | Nakaoka | 307/272.3 |
| 4,899,070 | 2/1990 | Ou et al. | 307/530 |
| 4,900,950 | 2/1990 | Dubajet | 307/272.3 |
| 4,902,907 | 2/1990 | Haga et al. | 307/272.3 |
| 4,970,408 | 11/1990 | Hanke et al. | 307/272.3 |
| 4,985,643 | 1/1991 | Proebsting | 307/548 X |
| 4,987,560 | 1/1991 | Hamano et al. | 365/200 |
| 5,027,008 | 6/1991 | Runaldue | 307/443 |
| 5,034,925 | 7/1991 | Kato | 365/200 |
| 5,039,875 | 8/1991 | Chang | 307/272.3 |
| 5,041,746 | 8/1991 | Webster et al. | 307/530 |
| 5,148,051 | 9/1992 | Dierling et al. | 307/272.3 |
| 5,157,630 | 10/1992 | Suwa et al. | 365/200 X |
| 5,166,545 | 11/1992 | Harrington | 307/272.3 |
| 5,191,245 | 3/1993 | Kang | 307/290 X |

FOREIGN PATENT DOCUMENTS 2123587  2/1984  United Kingdom .

OTHER PUBLICATIONS

Tolley et al, "72K RAM Stands up to Soft and Hard Errors", *Electronics*, Jun. 16, 1982, pp. 147–151.

*Primary Examiner*—David R. Hudspeth
*Attorney, Agent, or Firm*—Robert Groover

[57] ABSTRACT

An integrated circuit memory comprising redundancy circuits with batteries of fuses to store the addresses of defective memory elements to be replaced by redundancy elements. The circuit used to read the state of the fuse comprises a current-voltage converter constituted by an inverter and a transistor. To prevent uncertainty over the state of the fuse when the power is turned on, two additional inverters in series are used between the outputs of the first inverter and the gate of a feedback transistor. These inverters are highly asymmetrical in opposite directions. This avoids the need for a power-on-reset circuit.

14 Claims, 2 Drawing Sheets

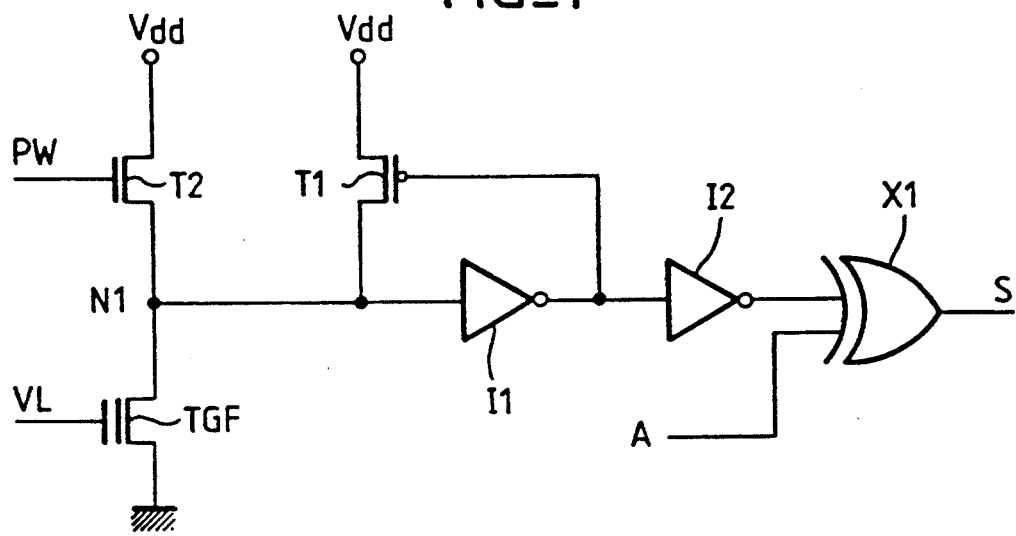
FIG_1
PRIOR ART
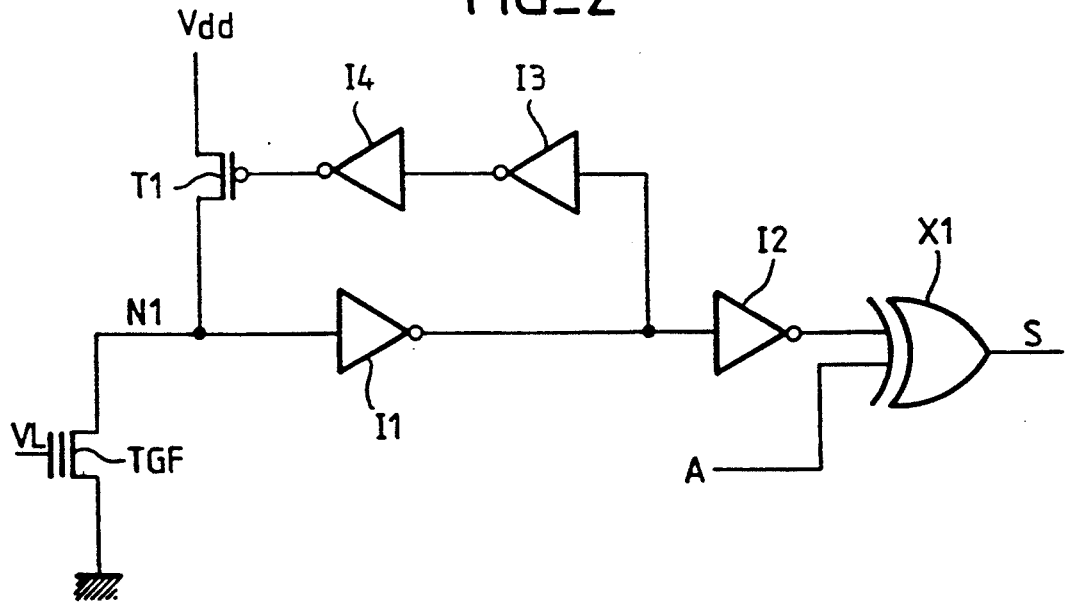
FIG_2

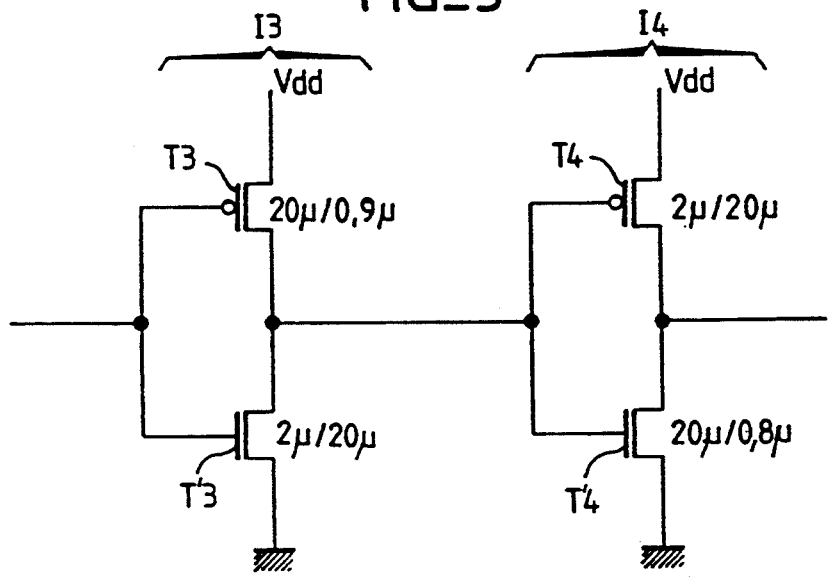
FIG_3
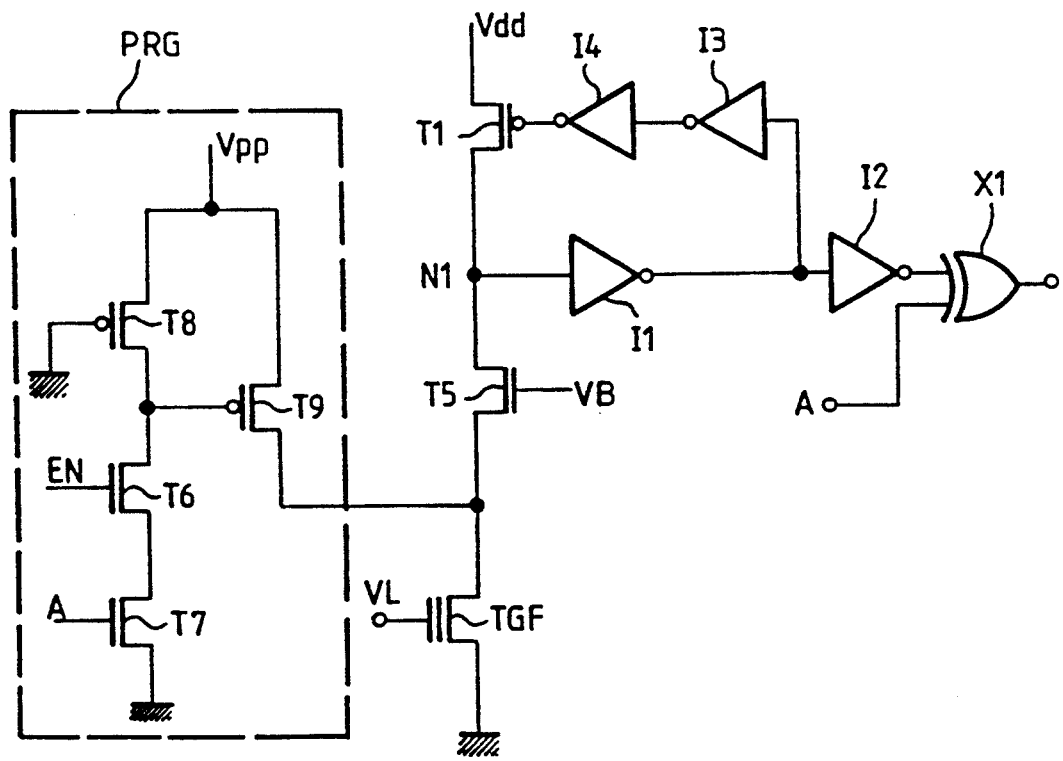
FIG_4

REDUNDANCY FUSE READING CIRCUIT FOR INTEGRATED MEMORY

BACKGROUND OF THE INVENTION

1. Field of the Invention

The invention relates to memories made in the form of integrated circuits and more particularly to memories that include redundancy circuits.

An integrated memory comprises numerous memory cells in rows and columns on a very small surface area and a technical defect in one cell leads to the discarding of the entire memory. This is prevented by using redundancy circuits that are put into operation if a defect is observed when the memory is being tested.

2. Description of the Prior Art

Most usually, the memory will include several replacement rows or several replacement columns (or several rows and several columns at a time). Each replacement row or column can replace a defective row or column of the memory.

However, the replacement should be transparent to the user, i.e. the user should be capable of applying the address of the defective row or column to the input of the memory in order to read or write at this address just as if it were not defective. The address of the defective rows or columns is therefore recorded inside the integrated circuit; when the user presents a defective row or defective column address to the input of the memory, it is the internal circuits of the memory that recognize it as being one of the defective addresses recorded, and that route the electrical signals towards the replacement columns. The user plays no role in this process.

To record the defective addresses, devices broadly designated as "fuses" have been used and are still used: a fuse defines a piece of binary information according to its state (blank or programmed); for each defective address to be registered, a battery of several fuses is used, equal in number to the number of bits used to define an address. For an address of p bits, there is a battery of p fuses. The state, whether intact or programmed, of the different fuses of a battery defines an address of p bits. If there are N redundancy rows or columns, i.e. if it is desired that it should be possible to replace N defective rows or columns by replacement rows or columns, then N batteries are needed.

When there is need for a replacement element to replace a defective element, the address of this defective element is stored in a battery of fuses, and a validation fuse associated with this battery is "burned out" or "fused" to indicate that it is effectively used to define an operation of replacement.

The fuses may be physical fuses (for example an open circuit element that is converted into a short-circuit when it is fused, or the reverse); or again, as is more frequent now, the fuses may be non-volatile memory elements such as UPROM (unerasable programmable read-only memory) transistors. These transistors are electrically programmed and can no longer be erased. The blank state of the transistors corresponds to an original state of the "fuse"; the programmed state of the transistor corresponds to a "fused" state of the fuse.

FIG. 1 shows a part of a prior art redundancy circuit. This part is designed to store an address bit of a defective element and to compare the stored bit with a corresponding bit of the received address; the comparison of the received address and of the stored address defines whether there is any reason to put the redundancy into operation. There are therefore as many circuits like that of FIG. 1 as there are bits in the address of the defective element to be replaced.

The defective address bit is stored in a fuse consisting herein of an UPROM type floating-gate transistor TGF. The state of this transistor, whether blank or programmed, defines the value of the stored bit. A reading voltage VL is applied to the control gate of this transistor. If the transistor TGF has remained in the blank state (not programmed), it means that the stored address bit is a zero bit. In this case, the transistor TGF is conductive in the presence of the reading voltage VL. If, on the contrary, the transistor TGF has been programmed, the stored address bit is a 1; in this case, the transistor remains off despite the reading voltage VL.

A current-voltage converter constituted by a P channel transistor T1 and two inverters I1 and I2 is used to read the current flowing in the transistor TGF to determine whether it is on or off. This converter gives a logic 0 voltage level if the transistor TGF is on, hence if the stored bit is 0 and a logic 1 voltage level if the transistor TGF is off, hence if the stored bit is 1.

An exclusive-OR gate X1 receives, firstly, the output of the converter (output of I2) and, secondly, a bit A of the addressed received at a given instant by the memory. As indicated here above, if the applied address comprises p bits, then there are p circuits identical to that of FIG. 1, each circuit making a comparison between a received address bit Ai and a same-order i stored address bit. It is only if there is a bit-to-bit coincidence between the received address and the stored address that the redundancy will be put into operation.

If the received address bit is identical to the stored bit, the exclusive-OR element gives a logic 0. If not, it gives a 1. It is only if all the outputs of exclusive-OR elements corresponding to the different bits are at 0 that the redundancy should be put into operation. A NOR element, not shown, receives all the outputs S of the exclusive-OR elements and delivers a logic 1 only if all its inputs are simultaneously at 0. It furthermore receives an additional input corresponding to a validation fuse, this input being at 0 only if the validation fuse has been programmed.

More specifically, the current-voltage converter (T1, I1, I2) has a first inverter I1, the input of which is connected to a circuit node N1 which is the drain of the transistor TGF. The output of the inverter I1 is connected to the gate of a P channel transistor T1, the source of which is at a positive supply voltage Vdd and the drain of which is connected to the node N1. The relative dimensions of the transistor T1 and of the transistors constituting the inverter I1 make it possible to adjust the current thresholds that prompt the switching over of the inverter I1 in one direction or in another. The inverter I2, cascaded with the output of the inverter I1, is optional. In the present case, it inverts the output logic level of the inverter I1 to define a logic 0 level when the transistor TGF is blank and conductive.

Finally, to finish the description of FIG. 1, a transistor T2, controlled by a logic signal PW, is connected between the supply Vdd and the node N1. The signal PW is created by a power-on-reset circuit (not shown). This signal is conventionally generated some instants after the power is reset in the integrated circuit. It is used to establish a logic 1 level unambiguously at the node N1 after the power-on-reset operation when the transistor TGF is in a programmed state (hence a non-conductive state despite the reading voltage VL). Indeed, in this case, when the power is turned on again, the node N1 is floating (with TGF non-conductive). At the outset, its potential may be close to zero. This takes the output of the inverter I1 to 1 and confirms that the transistor T1 is off. The node N1 therefore remains floating and has no reason to tend towards 1 which, however, it should do to represent the programmed state of the transistor TGF. This is all the truer as there are substantial parasitic capacitances between the node N1 and the ground. To prevent this, the signal PW makes the transistor T2 unambiguously conductive for a brief instant, after the power has been reset, thus taking the node N1 to 1. The output of the inverter I1 goes to 0 and makes the transistor T1 conductive, then confirming the state 1 of the node N1 even after the disappearance of the signal PW.

One of the aims of the present invention is to avoid the need to use a power-on-reset signal PW. The circuit that produces this signal is indeed difficult to devise. It occupies much space and consumes substantial current.

In one approach, a capacitor has been placed between the output of the inverter I1 and the ground. If this capacitor is discharged at the power-on-reset operation, then it will tend to keep the transistor T1 conductive for a certain period of time during the power-on-reset operation and the node N1 will therefore have the time to rise to 1 by means of the transistor T1, after which the situation will be normal. Experience has shown that this approach is not satisfactory, firstly because the capacitor is bulky and secondly because it is difficult to adjust this capacitor in the technology of integrated circuits. There are uncertainties about its value and hence about its operation.

This is why, according to the invention, there is proposed a circuit that provides a satisfactory solution to this problem, especially by eliminating the need for a power-on-reset signal PW, in achieving this goal without downgrading the other characteristics of the circuit.

According to the invention, it is proposed to eliminate the transistor T2 and to place two additional inverters in series between the output of the inverter I1 and the gate of the transistor T1, each of these two additional inverters comprising two highly asymmetrical transistors, and the asymmetry being in the opposite direction for the two inverters.

This asymmetry is in a direction that tends to facilitate the operation of turning on the transistor T1 of the current converter.

SUMMARY OF THE INVENTION

The invention therefore proposes an integrated memory comprising a redundancy circuit with at least one battery of fuses defining an address of a defective element and a means to put a repair element into operation when an address applied to the memory corresponds to an address stored in the battery of fuses, the redundancy circuit comprising, associated with each fuse, a current-voltage converter having an input connected to the fuse, this converter comprising an inverter, the input of which constitutes the input of the converter and the output of which controls the gate of a feedback transistor, this transistor having its source connected to a supply voltage and its drain connected to the input of the inverter, the memory being one wherein a set of two additional inverters in series is placed between the output of the first inverter and the gate of the transistor, the inverters each comprising two highly asymmetrical transistors and the asymmetry taking place in the reverse direction for the two inverters.

The invention is applicable not only to the particular case of the memory redundancy circuits but also to all cases where a similar problem arises. This is why the invention more generally proposes a circuit for reading the state of a memory cell, comprising a current/voltage converter constituted by an inverter and a feedback transistor, wherein the output of the inverter is connected to the gate of the feedback transistor by means of two inverters in series, each comprising two highly asymmetrical transistors, the asymmetry being in reverse for the two inverters.

The first inverter will comprise a transistor with a first type of conductivity, the channel width-to-length ratio of which is far greater than 1 and a transistor with a second type of conductivity, the channel width-to-length ratio of which is far smaller than 1. The reverse will be the case for the second inverter.

In a preferred embodiment, the transistor having its gate controlled by means of the set of two inverters in series is a P channel MOS transistor. The first inverter comprises a P channel transistor with a big channel width-to-length ratio and an N channel transistor with a small channel width-to-length ratio. The second inverter, on the contrary, has a P channel transistor with a small channel width-to-length ratio and an N channel transistor with a big channel width-to-length ratio.

BRIEF DESCRIPTION OF THE DRAWINGS

Other features and advantages of the invention shall appear from the following detailed description, made with reference to the appended drawings in which:

FIG. 1, already described, represents a partial drawing of the redundancy circuit of a prior art memory;

FIG. 2 shows a diagram modified according to the invention;

FIG. 3 shows a detailed view of the inverters used;

FIG. 4 is a detailed diagram of a redundancy circuit incorporating the invention.

MORE DETAILED DESCRIPTION

The memory according to the invention may, in a standard way, comprise a network of rows and columns of cells that can be addressed by means of a row decoder and a column decoder. The row decoder is used to designate a determined row when it receives a row address. The column decoder receives a column address and accordingly activates a multiplexer to designate a determined word of the selected row. The multiplexer then selects columns corresponding to this word and makes it possible to connect these columns to input/output pads. These pads are used for the transmission, in reading and writing modes, of a word of data elements recorded in the memory. This organization, while it is not the only one possible, is the one most widely used and shall be taken as a basis to illustrate the present invention.

The integrated circuit further comprises redundancy circuitry.

To simplify the explanation, it will be assumed that the only redundancy elements are repair columns designed to replace defective columns. However, there could also be repair rows to replace defective rows.

A respective redundancy circuit is planned for each repair column. This circuit has the following functions:

it has the address of the defective column in memory;

it receives the column addresses applied to the input of the memory;

it remains inactive if the address does not correspond to the recorded address;

it routes the repair column towards the input-output pads instead of the defective column when it receives the address corresponding to the defective column.

The core of the redundancy circuit modified according to the invention is shown in FIG. 2.

As in the case of FIG. 1, it should be understood that the circuit of FIG. 2 corresponds only to the storage of an address bit of a defective element, and that the entire redundancy circuitry comprises, for each defective column, the replacement of as many circuits of the type shown in FIG. 2 as there are bits in the column address.

Furthermore, to simplify the drawing, the circuitry used to program the state of the fuse is not shown in FIG. 2, and other circuit elements that have no bearing on an understanding of the invention have not been shown either. However, a fuller diagram is given in FIG. 4.

As in the case of the description of FIG. 1, the fuse is assumed herein to be an unerasable, electrically programmable floating-gate transistor.

All the elements identical to those of FIG. 1 and connected in the same way as in FIG. 1 bear the same references and shall not be described again. They play the same role as the one described with reference to FIG. 1. These elements are the transistor TGF and its reading voltage VL, the inverter I1 and the feedback transistor T1 forming part of the current-voltage converter used to read the state of the fuse, the optional inverter I2 and the exclusive-OR element X1 receiving the output of the current-voltage converter and a current address bit A.

The current-voltage converter also comprises essentially the inverter I1 and the transistor T1. The transistor T1 is preferably a P channel transistor and is then connected between the positive voltage Vdd and the input of the inverter I1 (this input being itself connected to the drain of the transistor TGF which has its source connected to the ground).

Instead of the situation where the output of the inverter I1 directly controls the gate of the transistor T1, it is seen in the figure that this output is connected to an assembly, in series, of two inverters I3 and I4, the output of this assembly being connected to the gate of T1.

The logic voltage level applied to the gate of T1 is the same as it would be if the control were to be direct, but the operation in starting mode is different because of the particular characteristics of the transistors constituting the inverters I3 and I4. These inverters are both highly asymmetrical, i.e. they each possess two transistors having very different dimensions. And the asymmetry is in the reverse direction for the two inverters.

FIG. 3 shows an exemplary embodiment that illustrates this particular feature.

The two inverters I3 and I4 of FIG. 3 are each constituted in a standard way by a P channel MOS transistor (T3 for I3, T4 for I4) in series with an N channel MOS transistor (T'3 for I3, T'4 for I4); the gates of the two transistors are joined to form the input of the inverter; the drains are joined to constitute the output of the inverter. The source of the P channel transistor (T3, T4) is connected to the positive supply Vdd; the source of the N channel transistor (T'3, T'4) is connected to the ground.

The transistor T3 preferably has a channel width-to-length ratio that is far greater than 1, preferably at least 10 and even greater than 20. In the preferred example, the ratio is 20 units to 0.9 units. The word "unit" is taken to mean unit of length in the drawing of the integrated circuit. The unit of length is for example about 2 micrometers in the memory.

It will be recalled that the length of the channel is taken in the direction of the flow of current, the width being taken in the transverse direction. The transistor T3 is therefore a P channel transistor capable of letting through substantial current in view of its great width.

By contrast, the N channel transistor T'3 has a width-to-length ratio that is far smaller than 1. The asymmetry between the two transistors of the inverter is therefore very great. Preferably, the width-to-length ratio is smaller than 1/5 or even 1/10. In the example shown, it is 2 units to 20 units.

For the inverter I4, the situation is exactly reversed. The P channel transistor T4 has a small width-to-length ratio, like the N channel transistor T'3 of I3, and the N channel transistor T'4 has a great width-to-length ratio like the transistor T3.

In the example shown, T4 has a channel width of 2 units and a channel length of 20 units (ratio of 1/10); and T'4 has a width of 20 units and a length of 0.8 units (ratio of 25).

The result thereof is the following operation when, firstly, the fuse has been programmed and, secondly, the supply voltage Vdd has been cut off and just turned on again: the output of I1 is assumed to be initially discharged. The transistor T3 very easily tends to become more conductive than T'3 because, firstly, its gate is at a relatively low potential and, secondly, its own internal resistance is far smaller than that of T'3. The output of I3 therefore remains easily close to the supply voltage Vdd.

The opposite is the case for the inverter I4: the gate of T'4 (N channel) is at a relatively high potential and this transistor has an internal resistance that is far smaller than that of T4. The output of the inverter I4 therefore very easily tends to approach zero. This turns on the transistor T1 which therefore permits the potential of the floating node N1 to rise towards Vdd. Even if the node N1 were to be initially at zero, which would tend to make the inverters I3 and I4 switch over in the opposite direction to the one just stated, the high asymmetry of the inverters would oblige the transistor T1 to be conductive very swiftly and for a period of time sufficient for the node N1 to rise to a fairly high level and then confirm the switch-over direction adopted at the very outset.

Should the floating-gate transistor TGF be blank, there is no problem. As soon as the supply voltage Vdd starts rising, the transistor TGF becomes conductive, drawing the node N1 towards zero and making the inverters I3 and I4 switch over in a direction tending to turn T1 off. There is no risk that the node N1 will remain floating. To be sure of the switching direction, it is however preferable that the transistor T1 have a small channel width-to-length ratio as compared with the transistor TGF. For example, TGF has a ratio of about 1 unit to 1 unit, and T1 has a ratio of about 2 units to 40 units.

FIG. 4 shows an detailed view of an exemplary embodiment of the redundancy circuit. The diagram of this circuit essentially repeats that of FIG. 2, with the addition of the elements needed to program the floating-gate transistor TGF. The state, whether blank or programmed, depends on the value of the address bit to be stored, namely the value of the address bit A applied to the memory when a malfunction is detected or when it is therefore decided to assign a battery of fuses to the repairing of this malfunction.

The programming circuit is designated by the reference PRG. For the programming, the drain of the transistor TGF is insulated from the current-voltage converter (I1, T1, I3, I4) by a transistor T5 controlled by a bias voltage VB. This voltage turns the transistor off during the programming and turns it on during the use of the memory.

The programming circuit PRG comprises means for the application, to the transistor TGF, of the relatively high voltage Vpp needed for its programming. This circuitry is triggered for example by a signal EN applied to the gate of a transistor T6. It is validated or not validated (depending on whether the fuse has to remain blank or be programmed) by a logic signal F applied to the gate of a transistor T7. In the figure, the transistor T8 plays the role of a resistor to limit the current in the arm T6, T7, T8. A transistor T9, controlled by the drain of T6, is used to apply the voltage Vpp to the drain of TGF during the simultaneous presence of the programming signal EN and of an address bit A equal to 1.

Finally, in the reading mode, the voltage applied to the control gate of the floating-gate transistor is a voltage VL capable of making it conductive if it is blank and incapable of making it conductive if it is programmed. In programming mode, the voltage applied to the control gate of TGF is the one suited to charging the floating gate; it depends on the type of transistor used.

What is claimed is:

1. An integrated circuit memory comprising:
   a redundancy circuit with at least one battery of fuses defining an address of a defective element and circuitry to put a repair element into operation when an address applied to the memory corresponds to an address stored in said battery of fuses, said redundancy circuit comprising, associated with each fuse, a current-voltage converter having an input connected to said fuse,
   said converter comprising a first inverter, the input of which constitutes the input of said converter and the output of which controls the gate of a feedback transistor,
   said feedback transistor having a source connected to a supply voltage and a drain connected to said input of said inverter; and further comprising
   first and second additional inverters in series between said output of said first inverter and said gate of said feedback transistor, said additional inverters each being highly asymmetrical transistors in opposite respective directions.

2. An integrated circuit memory according to claim 1, wherein said first additional inverter comprises a transistor with a first type of conductivity having a channel width-to-length ratio far greater than 1, and a transistor with a second type of conductivity having a channel width-to-length ratio which is far smaller than 1.

3. An integrated circuit memory according to claim 1, wherein said second additional inverter comprises a transistor with a first type of conductivity having a channel width-to-length ratio far smaller than 1, and a transistor with a second type of conductivity, having a channel width-to-length ratio far greater than 1.

4. A memory according to claim 1, wherein said feedback transistor is a P channel MOS transistor, wherein the first inverter comprises a P channel transistor with a big channel width-to-length ratio and an N channel transistor with a small channel width-to-length ratio, and wherein the second inverter comprises a P channel transistor with a small channel width-to-length ratio and an N channel transistor with a big channel width-to-length ratio.

5. The memory of claim 1, wherein said first inverter is directly connected to be driven by said reading node.

6. The memory of claim 1, wherein said second inverter is directly connected to be driven by said first inverter.

7. A circuit for reading the binary state of a cell, comprising an inverter connected to the cell and a feedback transistor, the source of which is connected to a supply voltage, and the drain of which is connected to the input of the inverter, wherein the output of the inverter is connected to the gate of the transistor by means of two inverters in series, each comprising two high asymmetrical transistors, the asymmetry being in reverse for the two inverters.

8. A reading circuit according to claim 7, wherein the first of said additional inverters comprises a P channel transistor with a large channel width-to-length ratio and an N channel transistor with a small channel width-to-length ratio, and wherein second said additional inverter comprises a P channel transistor with a small channel width-to-length ratio and an N channel transistor with a large channel width-to-length ratio.

9. An integrated circuit memory, comprising:
   an array of memory cells;
   address decoding circuitry connected to receive externally generated addresses, and accordingly to access cells from said array;
   redundant element portions, each including multiple memory cells corresponding to a subset of said cells of said array;
   redundancy substitution circuitry, comprising multiple sets of nonvolatile memory cells, and match detection logic connected to receive at least some bits of said externally generated addresses and to check for matches with defect location addresses stored in said nonvolatile memory cells; wherein at least some ones of said nonvolatile memory cells each include:
   an n-channel floating-gate transistor, connected to sink current from a respective reading node;
   a first inverter operatively connected to be driven by said reading node;
   a second inverter operatively connected to receive an output from said first inverter, and a third inverter directly connected to receive an output from said second inverter; and
   a P-channel feedback transistor connected between said reading node and a scond power supply, and having a gate directly connected to be driven by an output of said third inverter;
   wherein said third inverter comprises an NMOS and a PMOS transistor, with said NMOS transistor being much stronger than said PMOS transistor; and wherein said secoind inverter comprises an NMOS and a PMOS transistor, with said PMOS transistor being much stronger than said NMOS transistor.

10. The memory of claim 9, wherein said first inverter is directly connected to be driven by said reading node.

11. The memory of claim 9, wherein said second inverter is directly connected to be driven by said first inverter.

12. An integrated circuit memory, comprising:

an array of memory cells;

address decoding circuitry connected to receive externally generated addresses, and accordingly to access cells from said array;

redundant element portions, each including multiple memory cells corresponding to a subset of said cells of said array;

redundancy substitution circuitry, comprising multiple sets of nonvolatile memory cells, and match detection logic connected to receive at lest some bits of said externally generated addresses and to check for matches with defect location addresses stored in said nonvolatile memory cells; wherein at least some ones of said nonvolatile memory cells each include:

a programmable transistor, connected to pass current from a first power supply voltage to a respective reading node;

a first inverter operatively connected to be driven in accordance with the state of said reading node;

a second inverter connected to receive an output from said first inverter, and a third inverter connected to receive an output from said second inverter; and a feedback transistor connected between said reading node and a second power supply, and connected to be driven by an output of said third inverter;

wherein said third inverter comprises a first transistor connected to said first power supply, and a second transistor connected to said second power supply; said first transistor being much stronger than said second transistor.

13. The memory of claim 12 wherein said first inverter is directly connected to be driven by said reading node.

14. The memory of claim 12, wherein said second inverter is directly connected to be driven by said first inverter.

* * * * *